(12) United States Patent
Furukawa et al.

(10) Patent No.: US 6,453,963 B1
(45) Date of Patent: Sep. 24, 2002

(54) VACUUM FILM LAMINATING APPARATUS

(75) Inventors: Tokinobu Furukawa; Kazuo Takahashi; Takeshi Ishida, all of Kudamatsu; Takehiko Hayashi, Matsudo; Hideaki Yamamoto, Kumage, all of (JP)

(73) Assignee: Hitachi Techno Engineering Co., Ltd., Tokyo (JP)

( * ) Notice: Subject to any disclaimer, the term of this patent is extended or adjusted under 35 U.S.C. 154(b) by 40 days.

(21) Appl. No.: 09/624,071

(22) Filed: Jul. 24, 2000

(30) Foreign Application Priority Data

Jul. 29, 1999 (JP) ............................................ 11-215960

(51) Int. Cl.⁷ ............................................... B32B 31/00
(52) U.S. Cl. ......................... 156/364; 156/363; 156/368
(58) Field of Search ................................... 156/381, 382, 156/362, 363, 364, 367, 368, 352, 556, 557, 559, 563, 543

(56) References Cited

U.S. PATENT DOCUMENTS

| 4,101,364 A |   | 7/1978 | Tsukada et al. |
| 4,844,758 A | * | 7/1989 | Hamamura et al. ........... 156/64 |
| 5,078,820 A | * | 1/1992 | Hamamura et al. ......... 156/267 |

FOREIGN PATENT DOCUMENTS

| DE | 37 25 007 A1 | 2/1989 |
| EP | 0 339 275 A2 | 11/1989 |
| EP | 0 460 621 A1 | 12/1991 |
| JP | 53-31670 | 9/1978 |
| JP | 5-338040 | 12/1993 |

* cited by examiner

Primary Examiner—Richard Crispino
Assistant Examiner—George R. Koch, III
(74) Attorney, Agent, or Firm—Antonelli, Terry, Stout & Kraus, LLP

(57) ABSTRACT

A film laminating apparatus attaches films to electronic circuit boards, such as printed circuit boards and silicone boards or wafers. The film laminating apparatus conveys a plurality of boards at intervals, forms pieces of lamination film at the intervals of the boards on a base film with a processing area between boards and continuously conveys the base film into a reduced-pressure chamber having a board loading port, a film loading port, a laminating mechanism for attaching the lamination film on the base film to the boards, and a board unloading port for ejecting the laminated boards. Shutters are provided for opening and closing shutter sections provided in the board loading port and the board unloading port of the reduced-pressure chamber, and a vacuum source is provided for evacuating the reduced-pressure chamber when the reduced-pressure chamber is closed by the shutters. A shutter section is equipped with a shutter in the film loading port of the reduced-pressure chamber, and a detector is provided for detecting when a processing area in the film between boards being fed into the reduced-pressure chamber is in the shutter section of the film loading port. A control means then operates the shutter means of the film loading port, the board loading port, and the board unloading port to close the reduced-pressure chamber according to the result of detection by the detecting means, and actuates the vacuum source to evacuate the reduced-pressure chamber to a desired degree of vacuum. Then, the laminating means is actuated.

8 Claims, 4 Drawing Sheets

VACUUM FILM LAMINATING APPARATUS

BACKGROUND OF THE INVENTION

This invention relates to an apparatus which attaches films to the surfaces of sheet materials (hereinafter simply called boards), such as printed circuit boards, electronic circuit boards, and silicone wafers; and, more particularly, the invention relates to a vacuum film laminating apparatus which continuously supplies films and boards into a reduced-pressure chamber and attaches films to each board in the chamber.

A conventional reduced-pressure film laminating apparatus, such as disclosed in Japanese Examined Patent Publication No. 53-31670 (1978), places the whole film laminating apparatus containing a roll of film (hereinafter referred to as a film roll) in a reduced-pressure chamber, and provides a board loading opening and a board unloading opening in the walls of the reduced-pressure chamber. Each opening has a pair of pressure rolls made of, for example, elastic materials which isolate the inside of the reduced-pressure chamber from the outside, making it possible for the boards to be introduced into and removed from the chamber. This reduces fluctuations in the degree of vacuum of the reduced-pressure chamber when boards are transferred into and out from the chamber and assures the efficiency of attaching films to boards at a reduced pressure.

Since this conventional vacuum film-laminating apparatus disposes a film roll in the reduced pressure chamber, the chamber cannot be made smaller. Further, when a new film roll is loaded in the reduced-pressure chamber, it takes a long time to reduce the chamber pressure down to a preset degree of vacuum. Furthermore, keeping a film roll for a long period of time under a vacuum condition may cause its quality to vary.

When boards are loaded into the reduced-pressure chamber, the pressure-rolls may frictionally cause dust to be deposited on the surfaces of the boards. The dust on the board surfaces may make film adhesion incomplete in the film lamination process and may damage board surfaces when they are compressed to be unloaded.

When the pressure rolls are worn out due to friction between the rolls and the boards, the hermetic sealing of the chamber is broken and the chamber cannot maintain a preset reduced pressure. This requires frequent replacement of pressure rolls; and, consequently, this makes it difficult for the conventional vacuum laminating apparatus to respond to the demands imposed on a high vacuum device.

Japanese Examined Patent Publication No. 53-31670 (1978) also discloses an embodiment in which the film roll is disposed outside the reduced-pressure chamber. This embodiment is necessarily equipped with means to feed film sheets into the reduced-pressure chamber, in addition to the provision of said board loading and unloading openings. This film feeding unit has a pair of pressure rolls made of elastic material to feed film sheets there through. However, this embodiment cannot avoid the problems which may be caused by friction between the boards and the pressure rolls.

SUMMARY OF THE INVENTION

The main purpose of the present invention is to provide a reduced-pressure film-laminating apparatus which can form a clean reduced-pressure chamber having a desired degree of vacuum in a short time and continuously attach films to each board in the reduced-pressure chamber.

Another object of the present invention is to provide a reduced-pressure film-laminating apparatus which continuously supplies boards and films into the reduced-pressure chamber and attaches films to the boards in the chamber without damaging them.

To realize the aforesaid objects, the reduced-pressure film-laminating apparatus in accordance with the present invention comprises:

board transfer means for transferring a plurality of boards at preset intervals;

film transfer means for forming film sheets on a base film at the same intervals as the boards are transferred by said board transfer means, wherein these intervals on the base film are treated as processing areas between boards;

a reduced-pressure chamber having a board loading port, a film loading port, laminating means for attaching films to each board on said base film in said chamber, and a board unloading port which ejects the laminated boards;

first shutter means providing a shutter for each of said board loading and unloading ports of the reduced-pressure chamber to open and close the port;

vacuum means for evacuating the reduced-pressure chamber when said respective shutter means close;

second shutter means providing a shutter for said film loading port on said reduced-pressure chamber;

detecting means for detecting the extent of a processing area between boards on the base film to the shutter section of said film loading port; and control means for operating said second shutter means of said film loading port, said board loading port, and said board unloading port according to the result of detection by said detecting means, thereby to close the shutters, for evacuating the reduced-pressure chamber to a preset degree of vacuum, and for turning on the laminating means.

In accordance with the present invention, the reduced-pressure film-laminating apparatus can supply films into the reduced-pressure chamber without contaminating the film sheets, and it can evacuate the reduced-pressure chamber to a desired degree of vacuum and attach films to clean boards.

DETAILED DESCRIPTION OF THE PREFERRED EMBODIMENTS

A reduced-pressure film laminating apparatus which represents a first embodiment of the present invention will be explained with reference to FIG. 1 and FIG. 2.

Figure 1:
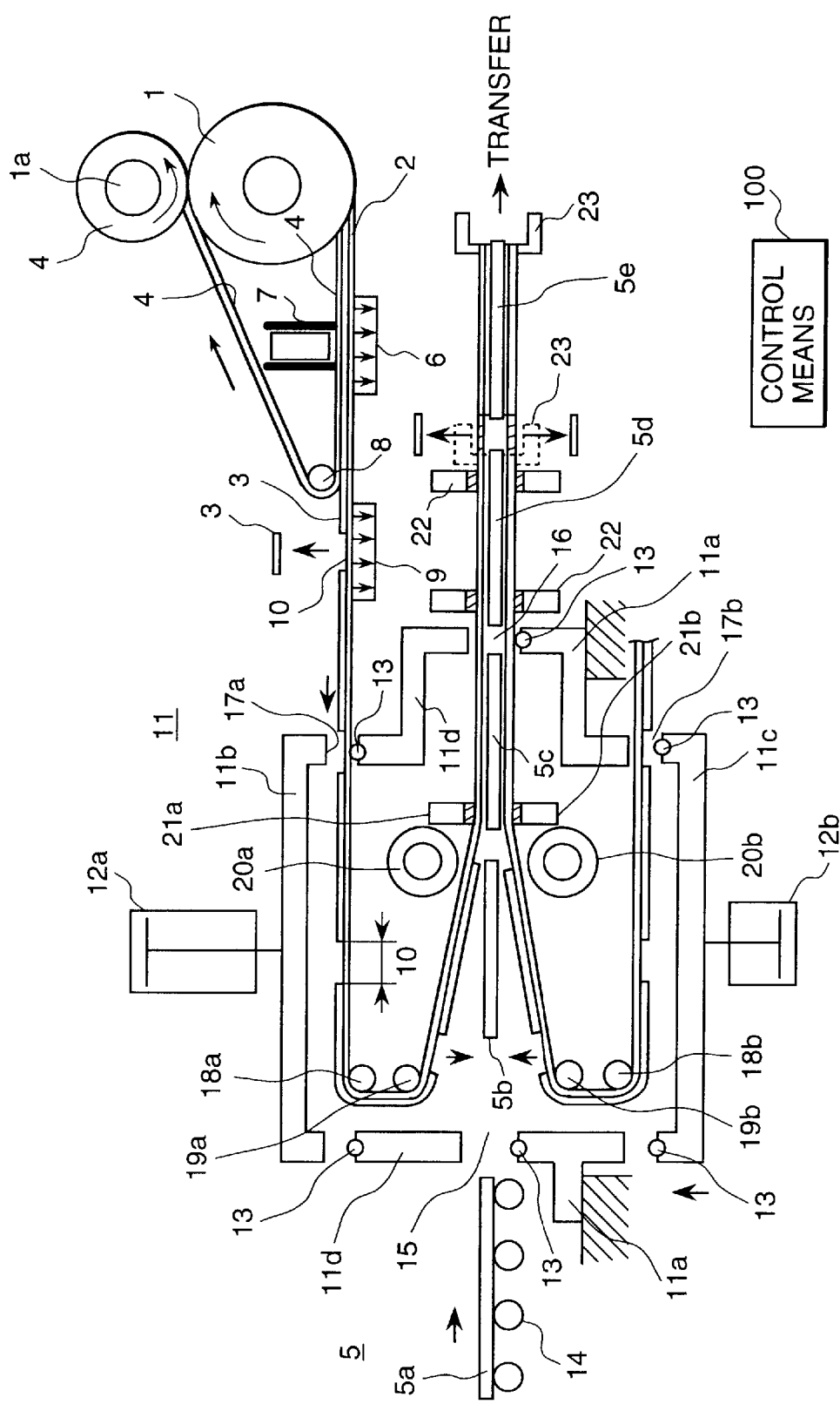
FIG. 1 is a schematic sectional view of a vacuum film-laminating apparatus which represents a first embodiment of the present invention.

FIG. 1 is a schematic sectional view of the vacuum film-laminating apparatus of the present invention. The vacuum film-laminating apparatus mainly comprises a film loading section, a reduced-pressure section, a board loading section, and film-laminating and board-ejecting section. FIG. 2 is a magnified view of the reduced-pressure section which is evacuated.

Referring to FIG. 1, the configuration of the film loading port will be explained. Although this embodiment is designed to attach film sheets (of a film roll) to both surfaces of each board 5a through 5e (where postfixes "a" to "e" are omitted when boards are generically termed), the attaching of film to the top board surfaces only will be explained below because the top and bottom surfaces of each board are treated in the same manner (vertically symmetrical to the transfer surface of the boards).

As shown in FIG. 1, the dry film roll 1 consists of a continuous sheet formed of a base film 2, resist films 3 formed on the base film 2, and a cover film 4 which covers the resist films 3 on the base film 2. These films are wound with the base film 2 facing outside on the roll 1. Only the cover film 4 of the dry film roll 1 is taken up by the cover film take-up section 1a. Since a resist film is attached to the surface of each board with a 3-mm margin around the resist film, the dry film roll 1 must have a preset width in the transverse direction of the board 5, and, further, the resist 3 must be placed a few millimeters inward from the front end (edge) and the rear end (edge) of each board (in the direction of movement of the board).

For this purpose, the base film 2 is reeled out towards a cradle 6 and into contact with the cradle and is perforated together with the resist film 3 and the cover film 4 by a film perforating means which is disposed above the cradle. In this case, it is possible to perforate only the base film 2, while cutting out both the resist film 3 and the cover film 4. The embodiment shown in FIG. 1 and FIG. 2 has two or more film perforating means at preset intervals. For example, the embodiment uses a perforator 7 which gives two lines of perforation at a time. This perforator can be a roulette-of the type used for sewing. The cover-film take-up section 1a continuously takes up the cover film which is separated from the resist film by the separating roller 8. The interval between two perforation lines made at one time by the perforator 7 is determined according to the preset intervals between boards as they are transferred. The interval between two perforation lines made on the films at one time by the perforator 7 is designated as a processing area between boards. When the perforated resist 3 on the base film comes in place on the cradle 9, the base film 2 is vacuum-held by the cradle 9 and the resist equivalent to the processing area between boards is picked up and removed from the base film, for example, by an adhesive means.

The non-resist area on the base film 2 from which the resist has been removed is termed a "processing area 10" to distinguish it from the resist area on the base film having resist 3 (film itself) to be attached to a board 5. The other form of the processing area 10 between boards will be explained later.

The configurations of the board loading section and the reduced-pressure section will be explained next.

As shown in FIG. 1, the chamber 11 in the reduced-pressure section comprises a stationary part 11a which is fixed relative to the board transfer surface, movable parts 11b and 11c which are oppositely disposed and can be moved towards the board transfer surface by means of cylinders 12a and 12b, and a movable part 11d which can move with the moving of the movable part 11b.

Vacuum seals 13 are provided on surfaces on which the movable parts 11d and 11c touch the stationary part 11a and surfaces on which the movable parts 11d and 11b touch each other. In other words, the stationary part 11a and movable parts 11b, 11c, and 11d are fragmentary sections of the reduced-pressure chamber which are cut in parallel with the board transfer surface, and the vacuum seals are applied to the cut-out surfaces of the sections. When the movable parts move away from the stationary part 11a, the spaces between the parts respectively form a board loading part (port), a board unloading part (port), a film loading part (port), and a film unloading part (port). When the movable parts close and touch the stationary part, a hermetic chamber 11 is formed. The movable part 11b is a lid-shaped part. The movable part 11d and the stationary part 11a are cylindrical parts, and the movable part 11c is pan-shaped. Their contact surfaces are provided with vacuum seals 13.

The board loading section comprises a board feeding conveyor 14 which conveys boards 5 into the reduced-pressure chamber 11 through a clearance between the stationary part 11a and the movable part 11d. In the description below, the clearances between the stationary part 11a and the movable part 11d are distinguished from each other as a board loading port 15 (in the board loading section) and a board unloading port (in the board unloading section).

Further, a clearance between the movable parts 11b and 11d of the reduced-pressure chamber 11 to feed a base film 2 without resists in the processing areas between boards (hereinafter abbreviated as processed base film 2) into the reduced-pressure chamber 11 is called a film loading port 17a. Similarly, a clearance between the stationary part 11a and the movable part 11c of the reduced-pressure chamber 11 to feed a processed base film 2 into the reduced-pressure chamber 11 is called a film loading port 17b.

The processed base films 2 are fed into the reduced-pressure chamber 11 through the respective film loading ports 17a and 17b, are conveyed further with the film body in contact with the rollers 18a and 18b and tension rollers 19a and 19b, which control the tension of each base film 2 in said reduced-pressure chamber 11, are further conveyed through a pair of lamination rollers 20a and 20b with a board sandwiched between two pieces of resist on the base films, and then are ejected out of the chamber 11 through the board unloading port 16. The lamination roller 20a, the clamper 21a, the roller 18a and the tension roller 19a are disposed above the conveyor surface. The lamination roller 20b, the clamper 21b, the roller 18b and the tension roller 19b are disposed below the conveyor surface. The postfixes of the symbols of these parts are omitted when they are used generically.

The roller 18b, the tension roller 19b, the lamination roller 20b, and the damper 21b are mounted on the stationary part 11d of the reduced-pressure chamber 11 and will not move up and down relative to the stationary part 11a. On the other hand, the roller 18a, the tension roller 19a, the lamination roller 20a, and the damper 21a are mounted on the movable part 11d of the reduced-pressure chamber 11 and can move up and down together with the movable part 11d.

When a board 5 is fed by the conveyor 14 into the reduced-pressure chamber 11 through the board loading port 15, the board 5 is conveyed in the reduced-pressure chamber 11 by a board edge clamping means which is not visible in the figure. For easy comprehension of lamination, boards 5 are identified by postfixes 5a (for boards which are loaded into the reduced-pressure chamber 11), 5b (for a board which has been loaded into the reduced-pressure chamber 11 and is ready to be laminated), 5c (for a board which is laminated with resist films 3 in the reduced-pressure chamber 11), 5d (for a laminated board whose base films 2 are still connected with the succeeding board 5c), and 5e (for a laminated board whose base films 2 are cut out).

The control means 100 calculates the quantity of dry film 1 to be fed, using the output of an encoder (which is invisible in the figure) mounted on the shaft of the dry film roll 1. The control means 100 also determines the length of the base film 2 in the reduced-pressure chamber 11. For example, the length of the base film 2 in the reduced-pressure chamber 11 is equal to the length of four boards having resist 3 when the processing area 10 of the base film 2 between boards is just at the film loading port 17. When the processing area 10 of the base film 2 between boards is just at the film loading port 17, the control means 100 stops the feed of the boards 5 into the reduced-pressure chamber 11 and actuates the cylinder 12a to move the movable part 11b down toward the movable part 11d. When the movable part 11b touches the processing area 10 of the base film 2 between boards on the vacuum seal 13 of the movable part 11d, the cylinder 12a further works to cause the movable part 11b to push the movable part 11d together with the lamination roller 20a, the clamper 21a, the roller 18a, and the tension roller 19a until the movable part 11d touches the vacuum seal 13 of the stationary part 11a. In this state, the movable part 11d at the board unloading section 16 touches the processing area 10 of the base film 2 between boards on the stationary part 11a.

In other words, the control means 100 actuates the cylinder 12 to hermetically close the reduced-pressure chamber 11. At the same time, the control means 100 causes the damper 21 to clamp the board 5c and the damper 22 outside the reduced-pressure chamber 11 to clamp the board 5d.

Then, the reduced-pressure chamber 11 is evacuated down to a desired degree of vacuum through a vacuum port (invisible in the figure) using a vacuum means which is not visible in the figure. The rollers 18 and the tension rollers 19 are moved perpendicularly to the movement of the boards 5c so that the distance between the resist 3 and the rear end (edge) of the board 5b facing the board loading port 15 (hereinafter referred to as the rear end of the board) may be wider than the distance between the resist 3 and the front end of the board 5b facing the board unloading port 16 (hereinafter referred to as the front end of the board). When the reduced-pressure chamber 11 is closed, the control means 100 working to feed the dry film 1 temporarily stops feeding the dry film 1 as the processing area 10 of the base film 2 between boards is chucked at the film loading port 17a. Then, the control means 100 moves the rollers 18 and the tension rollers 19 so that a section of base film longer than at least the length of two boards (four boards in this embodiment) may exist in the reduced-pressure chamber 11 when the chamber 11 is closed. In other words, the control means 10 works as a film length control mechanism.

The optimum length of the base film existing in the reduced-pressure chamber 11 when the chamber 11 is closed (equivalent to the length of four boards in this embodiment) is determined in consideration of the fact that a longer film length left in the chamber requires a wider chamber space and more evacuation time although it makes the tension control easier and that a shorter film length left in the chamber after lamination makes the tension control harder.

Figure 2:
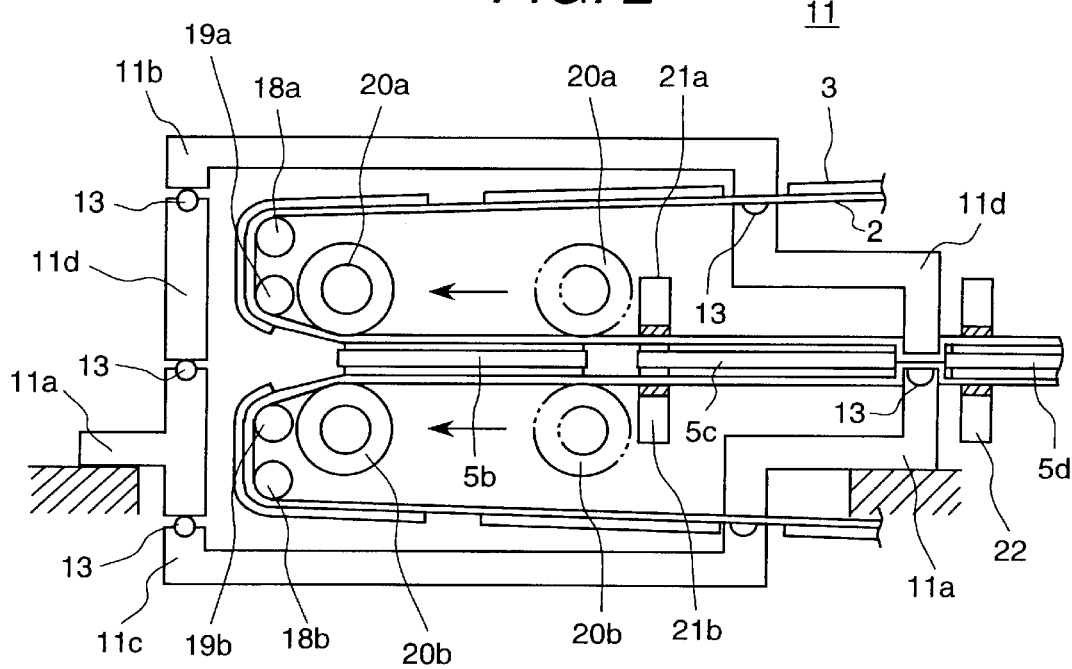
FIG. 2 is a magnified sectional view of the reduced-pressure section of said vacuum film laminating apparatus of FIG. 1.

When the reduced-pressure chamber 11 reaches the preset degree of vacuum, the lamination rollers 20 are positioned as indicated by dotted circles in FIG. 2, and then they move towards roller positions indicated by the solid circles. During this movement from the front board end to the rear board end with the chamber in the vacuum state, the lamination rollers 20 having a heating means attach the resist 3 evenly to the board surfaces with heat and pressure. This lamination causes no air bubbles or wrinkles in the laminated resist films.

After lamination is complete, the lamination rollers 20 go back to the roller positions indicated by dotted circles in FIG. 2.

Referring to FIG. 1 again, the laminated board unloading section will be explained. This unloading section comprises a board-edge transfer means (invisible in FIG. 1), a clamper 22, a base film removing means (invisible in FIG. 1), and a clamper 23 downstream of the board unloading port 16 outside the reduced-pressure chamber 11.

When the lamination rollers 20 go back to the roller positions indicated by dotted circles (invisible in FIG. 2), the control means 100 stops the vacuum means (invisible in FIG. 1), releases the clamper 21 in the reduced-pressure chamber 11 and the clamper 22, outside the reduced-pressure chamber 11, and actuates the cylinders 12a and 12b to open the reduced-pressure chamber 11 as indicated in FIG. 1. At this time point, lamination of the resist films 3 onto the board 5b is completed.

Outside the chamber 11, the front end (edge) of the laminated board 5d is clamped by the clamper 23 (indicated by dotted lines) and the clamper 23 moves right (in the figure) by the length of one board.

As the damper 23 moves right, the laminated boards 5b and 5c having resists attached to them are moved towards the board unloading port 16 by the board edge clamping means (invisible in FIG. 1) in the reduced-pressure chamber 11. When the rear end of the laminated board 5c comes into alignment with the dampers 21, the control means 100 feeds a new part of the dry film 1 into the reduced-pressure chamber 11 through the film loading port 17, and a new board 5a is introduced through the board loading port 15 from outside the reduced-pressure chamber 11.

The board 5c whose rear end is between the dampers 21 in the reduced-pressure chamber 1 moves to the position of the board 5d in the board unloading section and the front and rear ends of the board are clamped by the dampers 22. These dampers work as an unloading mechanism which can hold at least two laminated boards.

The clampers holding the front end of the board are disposed just upstream of a base film removing means (invisible in FIG. 1). While the dampers 23 clamp the board 5e at the damper position indicated by solid lines, the base film removing means, for example, a vacuum-pickup means (invisible in FIG. 1) vacuum-picks the base film in the processing area between boards (at the front end of the board 5d). As the base film 2 already has perforations in the processing area 10 between boards made by the roulette type device, the processing area 10 between boards is easily removed by vacuum-picking, and the boards 5d and 5e are separated from each other.

Then, the dampers 23 release the board and the board edge clamping means (invisible in FIG. 1) sends the board 5e to the succeeding processes. After this, the dampers 23 return to the initial position and move to the front end of the board 5d. The dampers 22 and 23 clamp the board 5d. Another new board 5a is fed for continuous lamination.

As explained above, the embodiments shown in FIG. 1 and FIG. 2 are hermetically sealed at the processing areas 10 of the base films 2 between boards, and vacuum seals are provided at the film loading port 17a, formed by the movable parts 11b and 11d, and at another film loading port 17b, formed by the movable part 11c and the stationary part 11a.

Similarly, the board unloading port 16 formed by the movable part 11d and the stationary part 11a is hermetically sealed at the processing area 10 of the base film 2 between boards by the vacuum seal 13. With this hermetical sealing, the reduced-pressure chamber may be easily evacuated to a desired degree of vacuum, which is retained during lamination. Further, since the roll of dry film 1 is provided outside the reduced-pressure chamber 11, the chamber 11 can be smaller and the desired degree of vacuum can be quickly obtained.

Further, since this embodiment feeds resist films into the reduced-pressure chamber 11 without applying any frictional force to or effecting contamination of the resist 3 to be attached to the boards 5, this embodiment can keep the boards clean during lamination in the reduced-pressure chamber, and thus greatly reduce the number of faulty laminated boards.

Also, when the laminated boards 5 are ejected from the reduced-pressure chamber 11, they are protected against damage by frictional forces from the vacuum seal, since the boards do not touch the vacuum seal. Further, this extends the service life of the vacuum seal 13 and does not require frequent replacement of the vacuum seal 13.

Another embodiment of the present invention will be explained with reference to FIG. 3.

Figure 3:
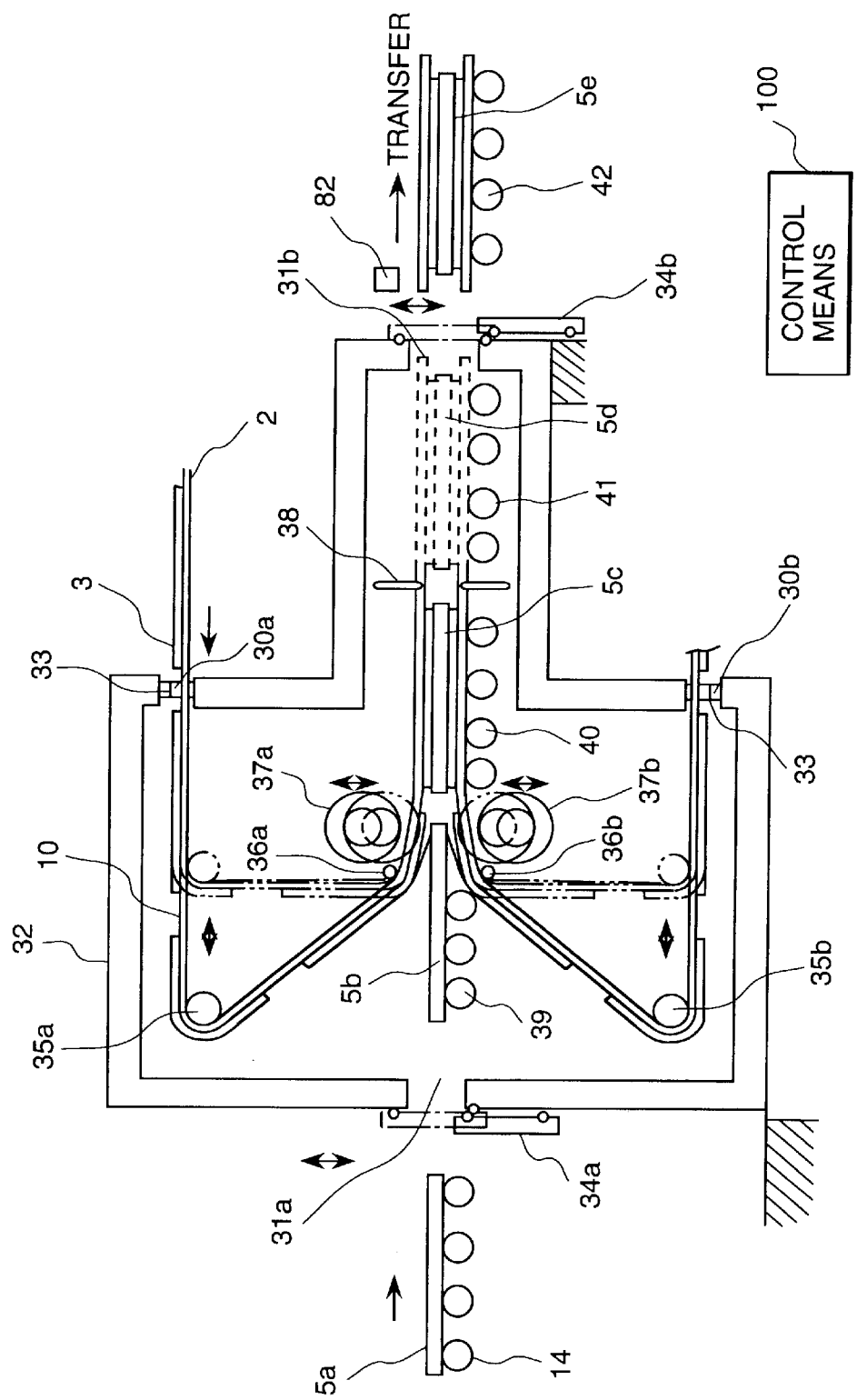
FIG. 3 is a schematic sectional view of a vacuum film-laminating apparatus which represents a second embodiment of the present invention.

FIG. 3 is a schematic sectional view of a vacuum film-laminating apparatus which represents a second embodiment of the present invention. In contrast to the previous embodiment, this embodiment moves the boards 5 in the reduced-pressure chamber 32 during lamination. The vacuum film-laminating apparatus of this embodiment mainly comprises a film loading section, a reduced-pressure section, a board loading section, and a laminated board unloading section. The film loading section and the board loading section of this embodiment are functionally almost the same as those of the first embodiment shown in FIG. 1 and FIG. 2 and identical symbols are used in the figures to identify the same or similar parts. Their detailed explanation will be omitted here.

As seen in FIG. 3, the reduced-pressure section comprises a reduced-pressure chamber 32 having film loading ports 30a and 30b, a board loading port 31a, and a board unloading port 31b. A vacuum means (invisible in FIG. 3) is provided for evacuating the reduced-pressure chamber 32 through an evacuation hole (invisible in FIG. 3) on the reduced-pressure chamber 32. The film loading ports 30a and 30b of the reduced-pressure chamber 32 are respectively equipped with an inlet valve 33 which can be operated by an opening and closing means, as will be explained later. When the inlet valve opens, the resist 3 and the base film 2 can be fed into the reduced-pressure chamber 32 without touching the port.

An example of means and methods for opening and closing the inlet valve 33 in the film loading port 30a will be explained with reference to FIG. 4 and FIG. 5.

Figure 4:
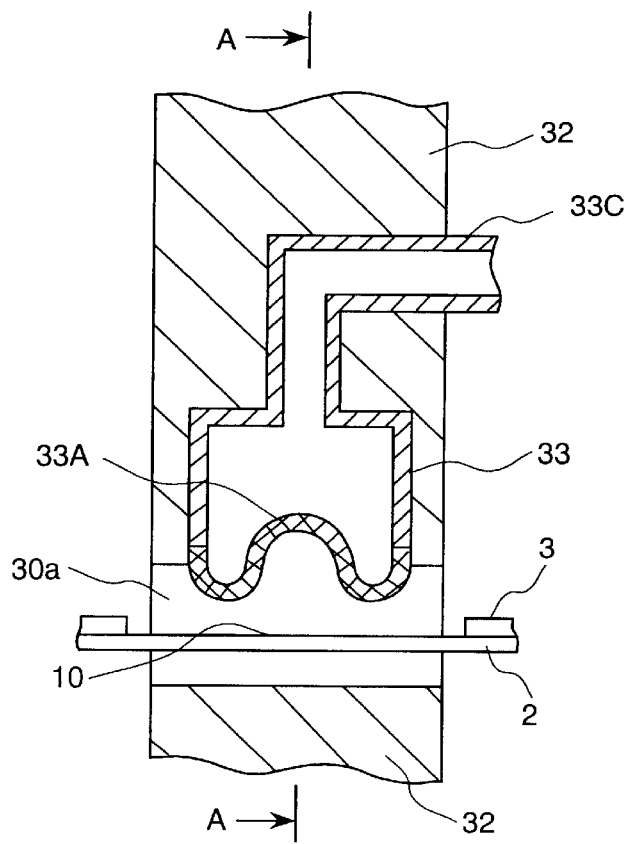
FIG. 4 is a magnified sectional view of the film loading port and its vicinity in the second embodiment illustrated in FIG. 3.
Figure 5:
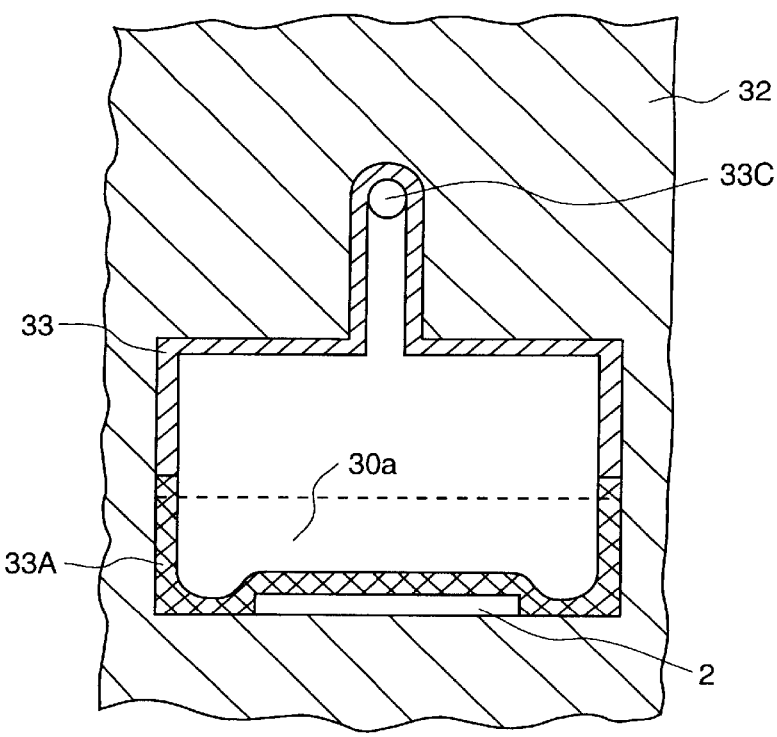
FIG. 5 is a sectional view taken on the line A—A of FIG. 4.

FIG. 4 and FIG. 5 respectively show a magnified view of the film loading port and its vicinity. FIG. 4 shows the inlet valve in its is open state. FIG. 5 shows a sectional view of a closed inlet valve taken on the line A—A in FIG. 4. Parts which are functionally identical are given an identical symbol in FIG. 4 and FIG. 5.

As seen from FIG. 4 and FIG. 5, the inlet valve is a hollow member having a deformable sealing material 33, for example, which is made of an elastic material at its end. The inlet valve is a little wider than the base film 2. The other end of the inlet valve 33 has an air inlet hole 33C through which air is supplied to the hollow part of the valve. This air inlet hole 33C is connected to an air supplying and evacuating means (invisible in FIG. 3). Air is taken into or from the inlet valve 33 through this inlet hole 33C.

To open the film loading port 30a, the inlet valve is evacuated through the air inlet hole 33C. The deformable sealing-material 33A shrinks to form a dent in the inlet valve 33 above the film conveying surface as shown in FIG. 4. When the processed base film 2 reaches a preset position in the reduced-pressure chamber 32, the processing area 10 of the base film 2 between boards comes under the inlet valve 33.

When air is supplied to the inlet valve 33 through the air inlet port 33C from the air supplying and evacuating means (invisible in FIG. 3), the deformable sealing material expands to touch the base film 2 at the processing area 10 between boards only. In other words, the film loading port 30a can be closed completely with the base film 2 in contact with the inlet valve 33 without touching the portion of the resist 3 on the base film 2.

Referring to FIG. 3 again, means for closing the board loading port 31a and the board unloading port 31b of the reduced-pressure chamber 32 will be explained.

The board loading port 31a and the board unloading port 31b respectively have shutters 34a and 34b which can move vertically. These shutters 34a, 34b are driven by a moving means (invisible in FIG. 3) to close the board loading port 31a and the board unloading port 31b to hermetically seal the reduced-pressure chamber 32.

The processed base films 2 and resists 3 are fed into the reduced-pressure chamber 32 through the film loading ports 30a and 30b, respectively, are conveyed further with the film body in contact with the moving rollers 35a and 35b and adjusting rollers 36a and 36b in said reduced-pressure chamber 32, and are further conveyed through a pair of lamination rollers 37a and 37b with a board 5 sandwiched between two pieces of resist 3 on the base films 2. The moving rollers 35a and 35b are movable left and right (in FIG. 3) by moving means which are invisible in FIG. 3. Similarly, the lamination rollers 37a and 37b are movable up and down perpendicularly to the board conveying surface by moving means which are invisible in FIG. 3. The adjusting rollers 36a and 36b are fixed at positions located by a preset distance away from the board conveying surface.

The inlet valves 33, the moving rollers 35a and 35b, the adjusting rollers 36a and 36b and the control means 100 for controlling their movement work together to adjust the length of the film in the reduced-pressure chamber 32 so that a preset length of film (length of at least two boards or more) exists in the chamber 32 when the chamber 32 is closed.

The lamination rollers 37a and 37b which can move vertically toward and away from the board conveying surface have a function to adjust the length of the film which is not in contact with the board in the closed reduced-pressure chamber.

The reduced-pressure chamber can contain a board 5b to be laminated and laminated boards 5c and 5d simultaneously. A cutter 38 is provided between the laminated boards 5c and 5d to cut the base films. Clampers (invisible in FIG. 3) are provided before and after the cutter 38 to hold the laminated boards together with the base films 2.

In this way, the board conveyors 40 and 41 and the dampers work to hold and pickup at least two laminated boards.

As explained above, when the processed base film 2 is fed into the reduced-pressure chamber 32 through the film loading port 30a and a board 5a is carried into the chamber 32 by the board conveyor 14, the board 5b on the board conveyor 39 is moved to the position of board 5c and the board 5c is moved to the position of the board 5d in the reduced-pressure chamber 32.

When the front end of the board 5b on the board conveyor 39 reaches a space between the lamination rollers 37a and 37b, the inlet valves 33 close the film loading ports 30. Further, the shutters 34a and 34b are moved up by the moving means (invisible in FIG. 3) to close the board loading port 31a and the board unloading port 31b. Thus, the reduced-pressure chamber 32 is closed hermetically. Then, the vacuum means (invisible in FIG. 3) starts to evacuate the chamber 32. When the vacuum pressure in the reduced-pressure chamber 32 reaches a preset pressure, the lamination rollers 37 start to move toward the board conveyor 39. In this case, the reduced-pressure chamber 32 contains resist 3 of a length equivalent to the length of two boards or more.

While the lamination rollers 37 maintain a pressure on the resists 3 against the board 5b, the board conveyors 39 and 40 work in synchronism to convey the board 5b to the unloading section. At the same time, the moving rollers 35 move right to allow the board 5b to be conveyed.

In other words, by moving the rollers 35 in synchronism with the movement of the board conveyor 39 while the base film 2 is clamped by the inlet valve 33 in the film loading port 30a, the lamination rollers 37 can evenly press the base film 2 on the whole surface of the board 5b (from the front end to the rear end) with force. At the same time, the lamination rollers 37 containing heating means apply heat to the resist 3 through the base film 2 during lamination. Thus, the resists 3 are attached strongly to the surfaces of the board 5b with heat and force.

In this case, as the board conveyor 40 also works in synchronism with the board conveyor 39, the laminated board 5c is carried to the board position 5d. When the board 5d is detected by a board detecting means 82, such as a photo sensor, in the board unloading port 31b or its vicinity, the upper and lower dampers (invisible in FIG. 3) vertically clamp the front and rear ends of the board 5c. The cutter 38 cuts the base film 2 in the processing area 10 between boards 5c and 5d to separate the boards 5c and 5d from each other. At the end of cutting, the shutters 34a and 34b and inlet valves 33a and 33b are opened.

When the reduced-pressure chamber 32 is opened to the atmosphere, the board conveyors 41 and 42 are driven to send the board 5d to the board position 5e outside the reduced-pressure chamber 32. In this case, the board conveyors 39 and 40 are not driven, and the chamber 32, which is open to the atmosphere, still contains the laminated board 5c.

When the board detecting means 82 in the board unloading port 31b or its vicinity detects no board in the board position 5d the board conveyor 14 starts to feed a new board 5a into the reduced-pressure chamber 32 and positions it in the board position 5b. Then, the reduced-pressure chamber 32 is closed and starts to effect another lamination.

As explained above, in accordance with the present invention, the inlet valve 33 presses the base film 2 at the processing area 10 between boards to hermetically close the reduced-pressure chamber 32 without touching any part of the resist 3. Therefore, the boards 5 will never be contaminated, by any dust of resist 3 and can be laminated perfectly.

The cutting of the cover film after lamination can be done outside the reduced-pressure chamber 32 to keep the inside of the reduced-pressure chamber 32 clean.

An embodiment similar to FIG. 3, which cuts the cover film outside the reduced-pressure chamber 32, will be explained with reference to FIG. 6.

Figure 6:
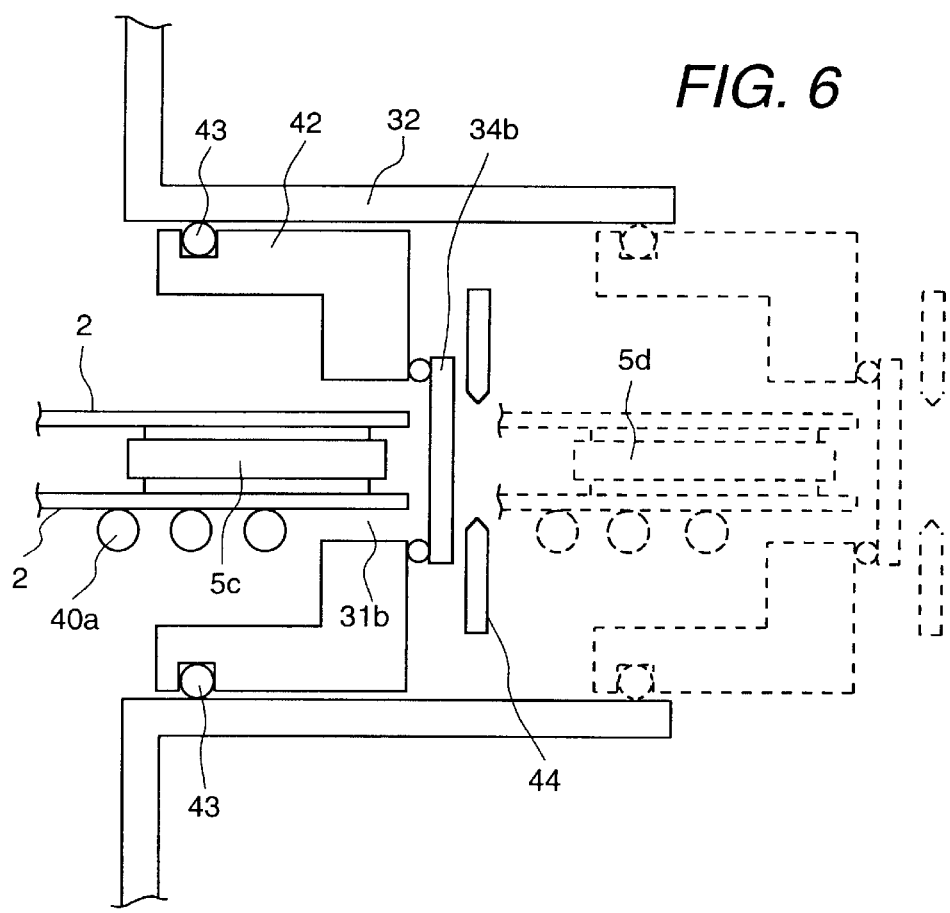
FIG. 6 is a fragmentary sectional view of the second embodiment illustrated in FIG. 3 showing an example of how the cover film of the laminate a board is cut out outside the reduced-pressure chamber.

FIG. 6 is an enlarged sectional view of the board unloading section of the reduced-pressure chamber 32 and its vicinity. The parts in FIG. 3 and FIG. 6 are assigned identical symbols when they are functionally identical. This embodiment, unlike the embodiment in FIG. 3, has an inner cylinder 42 in the board exit side (board unloading part) 31b of the reduced-pressure chamber 32. A shutter 34b is provided on the outer side of the inner cylinder 42, and a cutter 44 is provided at the outer side of the shutter 34b. Further, a board conveyor 40a which can move together with the inner cylinder 42 is provided on the downstream side of the board conveyor which holds the board 5c in the reduced-pressure chamber 32.

As shown in FIG. 6, the inner cylinder 42 can be moved (by a moving means which is invisible in FIG. 6) outwards in the reduced-pressure chamber 32 during lamination. The hermetical sealing of the reduced-pressure chamber 32 is assured by the sealing material 43 provided between the reduced-pressure chamber 32 and the inner cylinder 42.

The shutter 34b provided on the board exit side 31b of the inner cylinder 42 is driven up and down by a moving means which is invisible in FIG. 6 and can also be moved left and right as the inner cylinder 42 moves. The cutter 44 is placed at the right side (on the atmosphere side) of the shutter 34b which is on the board exit side of the reduced-pressure chamber 32. In FIG. 6, the inner cylinder 42 in solid lines indicates the cylinder 42 which is ready to move and the inner cylinder 42 in dotted lines indicates the cylinder 42 which moved furthest. When the inner cylinder 42 moves, the board conveyor 40a having the board 5c moves right separate from the board conveyor 40. The board 5c is carried to the board position 5d. In the descriptions below, the inner cylinder 42 before movement is distinguished from the inner cylinder 42 after movement.

Unlike the embodiment shown in FIG. 3, the embodiment in FIG. 6 has a board detecting means (invisible in FIG. 6) which detects the front end of the board 5c in the vicinity of the board unloading port 31b of the inner cylinder 42. When the board detecting means detects the front end of a laminated board 5c, the inner cylinder 42 and the board conveyor 40a having the laminated board 5c move right (in the figure) separate from the board conveyor 40.

When the inner cylinder 42 reaches the rightmost end (indicated by the dotted lines), the shutter 34b moves down to open the reduced-pressure chamber 32. In this case, the film loading port 30 of the reduced-pressure chamber 32 is closed as shown in FIG. 3 and the base film 2 is located in the dotted position (in FIG. 3) by the movement of the moving roller 35a.

Just when the shutter 34b is opened, the laminated board 5d is held in the dotted position 5d on the board conveyor 40a, but the board conveyor 40a starts to convey the board sd rightward and at the same time, the inner cylinder 42 moves back to the home position together with the open shutter 34b and the cutter 44. Simultaneously, a board supporting member (invisible in FIG. 6) is inserted under the laminated board 5d from the right of the figure to support the laminated board. Therefore, when the inner cylinder 42 returns to its home position, the laminated board 5d is left on the supporting member from the board conveyor 40a.

When the inner cylinder 42 moves back (left) to the home position (indicated by the solid lines) with the shutter 34b (or the reduced-pressure chamber 32) open, the board conveyor 40a which moved back together with the inner cylinder 42 stops just before the front end of a board 5c on the board conveyor 40. The cutter 44 cuts the base film 2 in the processing area between the laminated boards 5c and 5d. Then the inner cylinder 42 returns to the home position (indicated by the solid lines in FIG. 6) without actuating the board conveyor 40 and the shutter 34b closes.

As explained above, since the embodiment in FIG. 6 cuts the cover film outside the reduced-pressure chamber 32, the embodiment can prevent any cutting dust from entering into the reduced-pressure chamber 32. Even when the cutting dust is sucked into the reduced-pressure chamber 32 (as the cover film cutting is done in the atmosphere), it is exhausted from the reduced-pressure chamber 32 during lamination under a vacuum pressure. Therefore, a clear lamination can be assured.

Although the embodiments in FIG. 1 through FIG. 6 attach a cover film 4 having resist 3 on each surface of a board 5, there will be no problem when the embodiments attach a cover film having resist on one of the board surfaces only. Further, the boards can be carried by edge-clamping transfer means instead of the conveyors which convey boards on them.

Further, the embodiments in FIG. 1 through FIG. 6 respectively used a roulette type device 7 to apply perforations to the base film 2 in the film loading section and remove a resist portion from the processing area 10 of the base film 2 between boards. However, it is possible to leave cover films in the processing areas between boards instead of removing cover films completely before feeding them into the reduced-pressure chamber. In this case, a dry film removing means is required to remove the resist 3 and the cover film 4 left in the processing areas between boards together with the base film 2.

Further, it is possible to make the processing areas 10, non-laminated areas, between boards on the base film 2 by cutting out the resist 3 and the cover film 4, perforating the base film 2, removing all cut-out cover films, and applying a tape piece as wide as the processing area between boards transversely onto the resist in the processing area between boards. The set of base film, resist, and tape in the processing area between boards is removed after lamination is complete to make the laminated boards separated.

It is also possible to detect the processing area 10 between boards in the film loading port by an optical sensor provided near the film loading port (by detecting a change in the intensity of light reflected in this area) or to detect it visually using an image sensor.

In accordance with the vacuum film laminating apparatus of the present invention, films and boards can be fed into the reduced-pressure chamber without being damaged and contaminated. The reduced-pressure chamber can obtain the desired degree of vacuum in a short time and films and boards can be continuously laminated in a very clear environment.

What is claimed is:

1. A vacuum film laminating apparatus comprising:
   board transfer means for conveying a plurality of boards at intervals;
   film transfer means for continuously conveying a film which is formed by pieces of a lamination film disposed on a base film at intervals on the base film which are the same as the intervals at which the boards are conveyed by the board transfer means, each of the intervals on the base film being defined as a processing area between boards on the base film;
   a reduced-pressure chamber including a board loading port, a film loading port, laminating means for respectively attaching the pieces of the lamination film to the boards through the base film, and a board unloading port for ejecting the laminated boards;
   first shutter means for opening and closing shutter sections provided in the board loading port and the board unloading port of the reduced-pressure chamber;
   vacuum means for evacuating the reduced-pressure chamber when the reduced-pressure chamber is closed by the first shutter means;
   a shutter section equipped with second shutter means in the film loading port of the reduced-pressure chamber;
   detecting means for detecting that the processing area between boards on the base film of the film conveyed by the film transfer means which is being conveyed into the reduced-pressure chamber is in the shutter section of the film loading port; and
   control means for
   operating the second shutter means of the film loading port and the first shutter means of the board loading port and the board unloading port to close the reduced-pressure chamber according to a result of detection by the detecting means,
   actuating the vacuum means to evacuate the reduced-pressure chamber to a desired degree of vacuum, and
   actuating the laminating means.

2. A vacuum film laminating apparatus according to claim 1, wherein the reduced-pressure chamber further includes:
   a cylindrical stationary part, a cylindrical movable part just above the cylindrical stationary part, a lid-like top movable part just over the cylindrical movable part which can move together with the lid-like top movable part, and a pan-like bottom movable part beneath the cylindrical stationary part; and
   the reduced-pressure chamber further including driving means which drives the lid-like top movable part and the pan-like bottom movable part towards the cylindrical stationary part, and sealing materials provided on surfaces on which the lid-like top movable part and the cylindrical movable part contact each other, surfaces on which the cylindrical movable part and the cylindrical stationary part contact each other, and surfaces on which the cylindrical stationary part and the pan-like bottom movable part contact each other.

3. A vacuum film laminating apparatus according to claim 1, wherein the second shutter means of the film loading port of the reduced-pressure chamber includes a deformable hollow sealing member including an air inlet/outlet port; and
   wherein the sealing member expands to press the processing area between boards on the base film against the film loading port to close the film loading port when air is supplied into the sealing member through the air inlet/outlet port, and shrinks to open the film loading port when air is evacuated from the sealing member through the air inlet/outlet port.

4. A vacuum film laminating apparatus according to claim 1, wherein the reduced-pressure chamber includes a film length adjusting mechanism including tension rollers to leave a film of length equivalent to the length of two boards or longer in the reduced-pressure chamber when the reduced-pressure chamber is hermetically closed.

5. A vacuum film laminating apparatus according to claim 1, wherein the reduced-pressure chamber includes a laminated board unloading mechanism including board clamping means which holds at least two laminated boards near the board unloading port of the reduced-pressure chamber.

6. A vacuum film laminating apparatus according to claim 1, wherein the reduced-pressure chamber includes a cylindrical member which can move along in a direction of movement of laminated boards in the board unloading port of the reduced-pressure chamber;

wherein the cylindrical member includes a shutter section; and wherein the vacuum film lamination apparatus further comprises cutting means, disposed outside the reduced-pressure chamber opposite the shutter section of the cylindrical member of the reduced-pressure chamber, for cutting the base film between unloaded laminated boards to separate the unloaded laminated boards from one another.

7. A vacuum film laminating apparatus according to claim 1, wherein the film conveyed by the film transfer means is a 3-layer film including a cover film as a top layer, a resist film constituting the lamination film as an intermediate layer, and the base film as a bottom layer;

wherein a respective piece of the resist film, without the cover film, as long as each of the boards conveyed by the board transfer means, is to be laminated to each of the boards conveyed by the board transfer means;

wherein the processing area between boards on the base film is a portion of the base film which is between pieces of the resist film to be respectively laminated on the boards conveyed by the board transfer means, each of the pieces of the resist film to be respectively laminated on the boards conveyed by the board transfer means being as long as each of the boards conveyed by the board transfer means; and wherein the portion of the base film which is between the pieces of the resist film to be respectively laminated on the boards conveyed by the board transfer means is one of (1) a portion of the base film without the resist film and without the cover film, (2) a portion of the base film with the resist film, without the cover film, and with a tape piece covering the resist film to make the processing area between boards nonadhesive; and (3) a portion of the base film with the resist film and with the cover film covering the resist film.

8. A vacuum laminating apparatus according to claim 1, further comprising film processing means for forming the pieces of the lamination film on the base film at the intervals on the base film which are the same as the intervals at which the boards are conveyed by the board transfer means.

* * * * *